United States Patent
Hamann et al.

(10) Patent No.: US 7,485,891 B2
(45) Date of Patent: Feb. 3, 2009

(54) MULTI-BIT PHASE CHANGE MEMORY CELL AND MULTI-BIT PHASE CHANGE MEMORY INCLUDING THE SAME, METHOD OF FORMING A MULTI-BIT PHASE CHANGE MEMORY, AND METHOD OF PROGRAMMING A MULTI-BIT PHASE CHANGE MEMORY

(75) Inventors: Hendrik F. Hamann, Yorktown Heights, NY (US); Chung Hon Lam, Willistion, VT (US); Michelle Leigh Steen, Danbury, CT (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/718,070

(22) Filed: Nov. 20, 2003

(65) Prior Publication Data
US 2005/0112896 A1 May 26, 2005

(51) Int. Cl.
*H01L 21/302* (2006.01)
(52) U.S. Cl. ............... 257/2; 216/41; 438/95; 438/98; 438/102; 438/689; 257/4; 257/5
(58) Field of Classification Search ........... 438/689; 216/41; 257/2
See application file for complete search history.

(56) References Cited

U.S. PATENT DOCUMENTS

| | | | | |
|---|---|---|---|---|
| 5,536,947 | A * | 7/1996 | Klersy et al. | 257/3 |
| 6,087,674 | A * | 7/2000 | Ovshinsky et al. | 257/2 |
| 6,864,503 | B2 * | 3/2005 | Lung | 257/30 |
| 6,893,912 | B2 * | 5/2005 | Lung | 438/240 |
| 6,927,410 | B2 * | 8/2005 | Chen | 257/2 |
| 6,943,365 | B2 * | 9/2005 | Lowrey et al. | 257/3 |
| 2003/0145257 | A1 * | 7/2003 | Fields et al. | 714/704 |
| 2003/0212724 | A1 * | 11/2003 | Ovshinsky et al. | 708/490 |
| 2004/0178401 | A1 * | 9/2004 | Ovshinsky et al. | 257/2 |
| 2005/0112896 | A1 * | 5/2005 | Hamann et al. | 438/694 |

OTHER PUBLICATIONS

Jpn. J. Appl. Phys. vol. 39 (2000) 745-751;Part 1, No. 28, Feb. 28, 2000 Investigation of Crystallization Behavior of Sputter-Deposited Nitrogen-Doped Amorphous Ge2Sb2Te5 Thin Films Hun Seo et al.*

* cited by examiner

*Primary Examiner*—Keith D. Hendricks
*Assistant Examiner*—Patricia George

(57) ABSTRACT

A multi-bit phase change memory cell including a stack of a plurality of conductive layers and a plurality of phase change material layers, each of the phase change material layers disposed between a corresponding pair of conductive layers and having electrical resistances that are different from one another.

10 Claims, 12 Drawing Sheets

MULTI-BIT PHASE CHANGE MEMORY CELL AND MULTI-BIT PHASE CHANGE MEMORY INCLUDING THE SAME, METHOD OF FORMING A MULTI-BIT PHASE CHANGE MEMORY, AND METHOD OF PROGRAMMING A MULTI-BIT PHASE CHANGE MEMORY

BACKGROUND OF THE INVENTION

1. Field of the Invention

The present invention relates to memory devices that can store more than one bit per memory cell.

2. Description of the Related Art

In conventional single-bit per cell memory devices, the memory cell assumes one of two information storage states, either an "on" state or an "off" state. This combination of either "on" or "off" defines one bit of information. A memory device using such single-bit cells to store n bits of data (n being an integer greater than 0) thus requires n separate memory cells.

Increasing the number of bits which can be stored in a single-bit per cell memory device involves increasing the number of memory cells on a one-for-one basis with the number of bits of data to be stored. Methods for increasing the number of memory cells in a single memory device have relied upon advanced manufacturing techniques that produce larger chips containing more memory cells or that produce smaller memory cells (e.g., by high resolution lithography) to allow more memory cells to be placed in a given area on a single chip.

An alternative to the single-bit per cell approach involves storing multiple bits of data in a single memory cell. Previous approaches to implementing multiple-bit per cell non-volatile memory devices have typically involved mask-programmable read only memories (ROMs). In one of these approaches, the channel width and/or length of the memory cell is varied such that $2^n$ different conductivity values are obtained which correspond to $2^n$ different states, whereby n bits of data can be stored by a single memory cell. In another approach, the ion implant for the threshold voltage is varied such that the memory cell will have $2^n$ different voltage thresholds (Vt) corresponding to $2^n$ different conductivity levels corresponding to $2^n$ different states, whereby n bits of data can be stored by a single memory cell.

Electrically alterable non-volatile memory (EANVM) devices capable of storing multiple bits of data per cell are also known. In these devices, the multiple memory states of the cell are demarcated by predetermined reference signal levels that define boundaries between adjacent memory states. The memory cell is read out by comparing a signal from the cell with the reference signals to determine the relative levels of the cell signal and the reference signals. The comparison results indicate whether the cell signal level is above or below the respective memory state boundaries, and thus collectively indicate the programmed state of the cell corresponding to the stored data. The comparison results are encoded to reproduce the stored data and complete the cell readout operation. Generally speaking, the number of reference levels required to demarcate n memory states for storing n bits of data is $2^{n-1}$. The number may be greater if, for example, the uppermost or lowermost memory state is to be bounded on both sides.

Conventional nonvolatile multilevel memories have many disadvantages, particularly at the circuit and architectural levels. Conventional multi-level memories require a large amount of wiring for reading and sensing the n number of bit per cell. The conventional multilevel approaches also have penalties on sensing speed, control complexity, and reliability. This is because the multilevel memories require very tightly programmed cell threshold voltage control. Furthermore, a high program voltage is needed to cover the wide threshold voltage range. Thus, some of the cells have to endure the high program voltages while maintaining their threshold voltages.

A need exists for a multi-bit memory cell that is simpler and that can be programmed with higher reliability compared to the conventional multi-bit memory cells.

SUMMARY OF THE INVENTION

An aspect of the present invention is to provide a memory cell that can store more than one bit.

Another aspect of the present invention is to provide a multi-bit memory cell having a simple structure with a minimal amount of wiring.

Another aspect of the present invention is to provide a multi-bit memory cell that can be easily and reliably programmed.

A multi-bit phase change memory cell according to an exemplary embodiment of the invention includes a stack of a plurality of conductive layers and a plurality of phase change material layers, each of the phase change material layers disposed between a corresponding pair of conductive layers and having electrical resistances that are different from one another.

In at least one embodiment of the invention, the phase change material layers are made of $Ge_2Sb_2Te_5$.

A method of forming a multi-bit phase change memory cell according to the invention includes forming a stack of a plurality of phase change material layers and a plurality of conductive layers, each of the phase change material layers disposed between a corresponding pair of conductive layers and having electrical resistances that are different from one another.

A method of forming a multi-bit phase change memory cell according to at least one embodiment of the invention further includes forming a dielectric layer between a first outer conductive layer and a second outer conductive layer and at sides of a plurality of intermediate conductive layers and the plurality of phase change material layers. The step of forming a dielectric layer includes forming a mask over the first outer conductive layer and etching the first outer conductive layer and a phase change material layer directly below the first outer conductive layer using the mask. First dielectric spacers are formed on sides of the mask, the first outer conductive layer and the phase change material layer directly below the first outer conductive layer. At least one intermediate conductive layer and a phase change material layer directly below the at least one intermediate layer are etched using the mask and first dielectric spacers as an etchant mask. Second dielectric spacers are formed on sides of the first dielectric spacers, the at least one intermediate conductive layer and the phase change material layer below the at least one intermediate conductive layer.

A multi-bit phase change memory according to an exemplary embodiment of the invention includes an array of multi-bit phase change memory cells. Each of the multi-bit phase change memory cells include a stack of a plurality of conductive layers and a plurality of phase change material layers, each of the phase change material layers disposed between a corresponding pair of conductive layers and having electrical resistances that are different from one another. A programming circuit writes data to the array of multi-bit phase change memory cells. A sensing circuit reads out data from the array of multi-bit phase change memory cells.

A method of programming a multi-bit phase change memory cell according to an exemplary embodiment of the invention includes phase changing at least one phase change material layer of the multi-bit phase change memory cell to change the overall resistance of the multi-bit phase change memory cell to one of $2^n$ number of resistances, where n is the number of bits stored in the memory cell.

In a method of programming a multi-bit phase change memory cell according to at least one embodiment of the invention, the step of phase changing includes inputting a current pulse to the at least one phase change material layer.

These and other objects and features of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DESCRIPTION OF PREFERRED EMBODIMENTS

In various exemplary embodiments, the multi-bit memory cell according to the invention includes $2^n$ phase change material layers, where n is the number of bits per cell. Conductive layers are disposed at the top and bottom of the cell and between individual phase change material layers. Multi-bit storage in the memory cell is obtained by crystallizing various phase change material layers. The phase change material layers can be crystallized by resistive heating of the phase change material layers.

Figure 1:
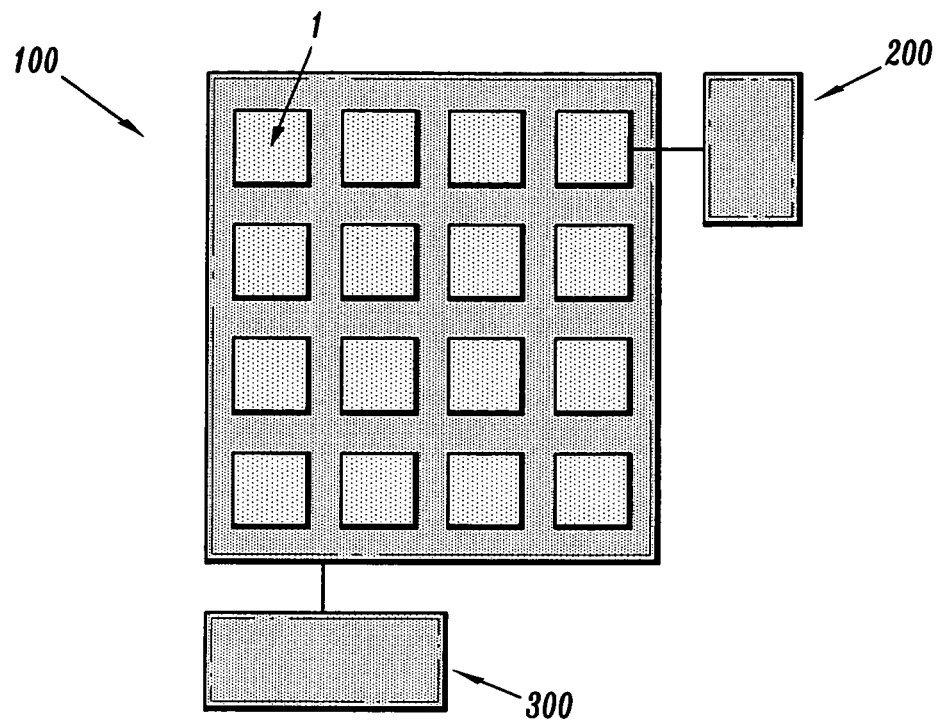
FIG. 1 shows a multi-bit phase change memory cell according to an embodiment of the invention.

FIG. 1 shows a multi-bit phase change memory 100 according to an exemplary embodiment of the invention. The multi-bit phase change memory includes a plurality of phase change memory cells 1 arranged in an array, a programming circuit 200, and a sensing circuit 300.

Figure 2:
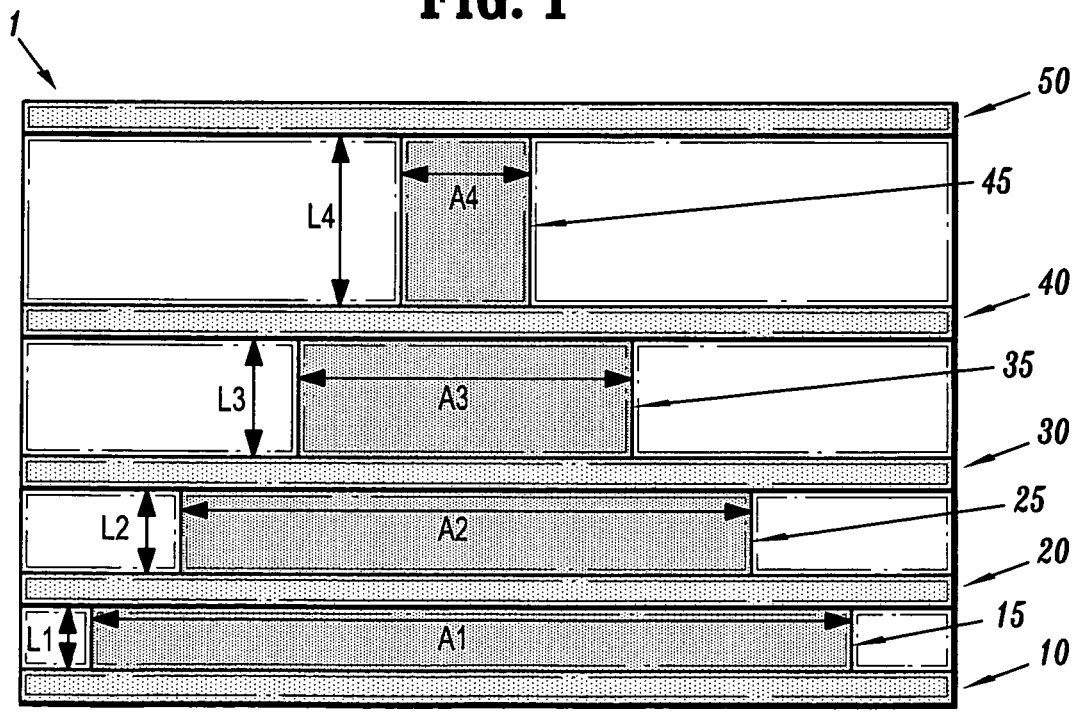
FIG. 2 is a cross-sectional view of a multi-bit phase change memory cell according an embodiment of the invention.

FIG. 2 is a cross-sectional view of a multi-bit memory cell used in the multi-bit phase change memory 100 according to an exemplary embodiment of the invention. The multi-bit memory cell 1 includes first through fourth phase change material layers 15, 25, 35 and 45, respectively. The multi-bit memory cell 1 according to the present embodiment can store 2 bits. It should be appreciated that in other embodiments of the invention the multi-bit memory cell can have any number of phase change material layers depending on the number of bits to be stored at each cell. Specifically, a multi-bit memory cell according to various exemplary embodiments of the invention includes $2^n$ phase change material layers, where n is the number of bits per cell. The phase change material layers can be made of any suitable phase change material, such as, for example, $Ge_2Sb_2Te_5$ (GST) or $Sb_2Te_3$. A first conductive layer 10 is disposed below the first phase change material layer 15, a second conductive layer 20 is disposed between the first and second phase change material layers 15 and 25, a third conductive layer 30 is disposed between the second and third phase change material layers 25 and 35, a fourth conductive layer 40 is disposed between the third and fourth phase change material layer 35 and 45, and a fifth conductive layer 50 is disposed over the fourth phase change material layer 45. The first conductive layer 10 is also a first outer conductive layer and the fifth conductive layer 50 is also a second outer conductive layer. The second through fourth conductive layers 20, 30 and 40 are also intermediate conductive layers. The conductive layers 10, 20, 30, 40 and 50 can be made of any suitable conductive material, such as, for example, TiN, W, TiW, Ta, TaN, Ti, Al, Cu, and Pt.

For example, each of the intermediate conductive layers may have the same dimension as an adjacent phase change material layer.

The first through fourth phase change material layers 15, 25, 35 and 45 have respective resistances R1, R2, R3 and R4. The resistances R1, R2, R3 and R4 have a direct relationship with the heights L1, L2, L3 and L4 and the resistivities $\rho1$, $\rho2$, $\rho3$ and $\rho4$ of the first through fourth phase change material layers 15, 25, 35 and 45, and an inverse relationship with the cross sectional surface areas A1, A2, A3 and A4 of the first through fourth phase change material layers 15, 25, 35 and 45. When the phase change material layers are in the amorphous state, $\rho1=\rho2=\rho3=\rho4$ and thus the difference between the resistances R1, R2, R3 and R4 can be set by adjusting the heights L1, L2, L3 and L4 and cross-sectional areas A1, A2, A3 and A4 of the first through fourth phase change material layers 15, 25, 35 and 45. In the present embodiment, the resistances R1, R2, R3 and R4 are set such that R1>R2>R3>R4 by making L1>L2>L3>L4 and A1<A2<A3<A4. In at least one embodiment, the heights L1, L2, L3 and L4 and the areas A1, A2, A3 and A4 are set such that R1/R2=R2/R3=R3/R4=1.5.

It should be appreciated that in other embodiments of the invention, the phase change material layers can be formed of different materials to provide the phase change material layers with different resistances. Also, in other embodiments, the phase change material layers can be doped with different levels of dopant to provide different resistances at each layer. For example, in exemplary embodiments of the invention, phase change material layers made of GST can be doped with nitrogen to change the resistivity, and thus the resistance, of the phase change material at each level. In still other embodiments, a combination of different layer materials, layer dimensions and levels of doping can be used to make the resistance and/or phase transition temperature of each phase change material layer different from one another.

Each of the phase change material layers 15, 25, 35 and 45 have a respective crystallization temperature Tc1, Tc2, Tc3 and Tc4. In operation, the phase change layers 15, 25, 35 and 45 are initially in an amorphous, or RESET, state.

The programming circuit 200 inputs a current pulse to a respective multi-bit phase change memory cell 1 as binary data is read into the multi-bit phase change memory 100. The programming circuit 200 can be any suitable circuit that generates a current pulse with varying current value and/or pulse length in response to binary data to be read into the multi-bit phase change memory 100. A current pulse passes through a respective multi-bit memory cell 1 and generates $I^2R$ (Joule heating) heat in the phase change material layers 15, 25, 35 and 45 of the memory cell 1. The current value and/or pulse length of the current pulse for each memory cell 1 is determined based on which one of the phase change material layers in the memory cell 1 is chosen to be phase changed from an amorphous to a crystalline state. In the present embodiment, one of four current values and/or pulse lengths are chosen depending on which phase change material layer(s) is to be phase-changed. The phase change material layer(s) to be phase changed is determined by the binary data to be stored in the memory cell 1.

The resistive heating that takes place in the phase change memory cell 1 will crystallize a predetermined number of phase change material layers. The resistive heating will raise the temperature of the predetermined number of phase change material layers to above their crystallization temperature, but not higher than their melting temperature. Preferably, the temperature of the predetermined number of phase change material layers should be raised to approximately one half their melting temperature. As an example, if only the fourth phase change material layer 45 is required to be phase changed, the programming circuit will input one of the four possible current pulses that will generate enough resistive heating to raise the temperature of the fourth phase change material layer to above its crystallization temperature Tc4. The current value and/or pulse length of the current pulse required to raise the temperature of the fourth phase change material layer 45 to above Tc4 is less than that required to raise the temperature of the other phase change material layers to above their respective crystallization temperatures. This is because the fourth phase change material layer 45 has a higher resistance compared to the other phase change material layers, so that more resistive heating is generated in the fourth phase change material layer 45 with the same current pulse.

Raising the temperature of the fourth phase change material layer 45 to above Tc4 will crystallize the fourth phase change material layer 45, thereby lowering its resistivity. After crystallization, two situations may occur depending on the dynamics of the crystallization process: (1) the resistivity of the fourth phase change material layer 45 will become $\rho 4'$, where $\rho 4' < \rho 3 = \rho 2 = \rho 1$, which will render R3=R4, or (2) the resistivity of the fourth phase change material layer 45 will become $\rho 4'$, where $\rho 4' << \rho 3 = \rho 2 = \rho 1$, which will render R4<<R3. In either case, the total resistance of the memory cell 1 will go to a well defined state after crystallization of the fourth phase change material layer 45.

In the present embodiment of the invention, the storage of multi-bit information is acheived by inputing one of four possible current pulses to a respective memory cell 1 to crystallize a predetermined number of the four phase change material layers within the memory cell 1.

In a RESET operation, the programming circuit 200 generates a current pulse sufficient to generate enough resisive heating in the phase change memory cells 1 to raise the temperature of the phase change material layers to above their melting temperatures. After all the phase change material layers have melted, the phase change memory 100 is reset such that $\rho 1 = \rho 2 = \rho 3 = \rho 4$ and R1>R2>R3>R4.

The sensing circuit 300 read out the data programmed into the multi-bit phase change memory 100. The sensing circuit 300 can be any suitable circuit that can sense resistance. The sensing circuit senses the total resistance of each of the memory cells 1 and determines the binary data based on the sensed total resistances. In the present embodiment, the sensing circuit 300 will sense one of four total resistances for each memory cell 1, each one of the resistances corresponding to a binary data state.

Figure 3:
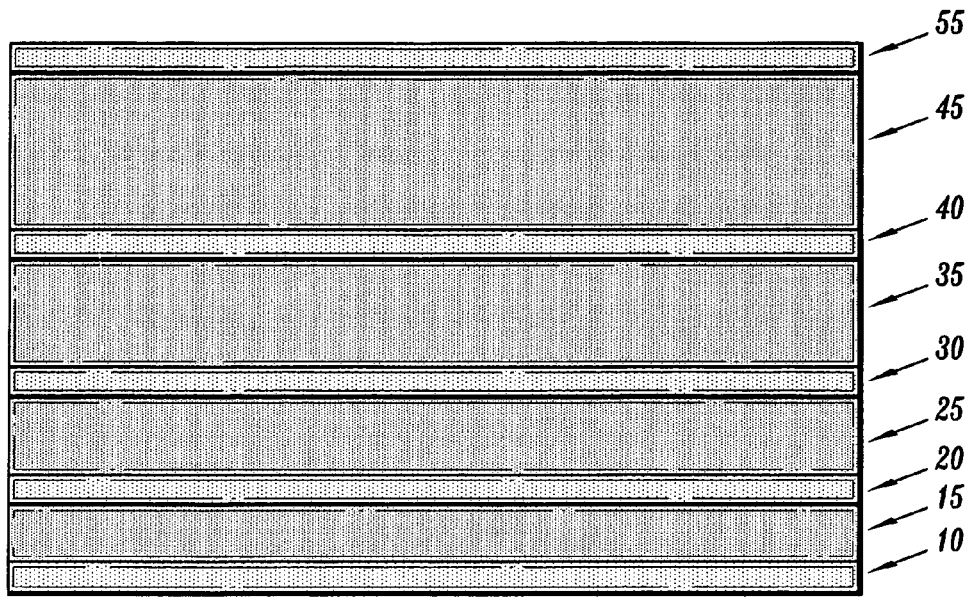
FIGS. 3-14 are cross-sectional views showing steps of a method of forming a multi-bit phase change memory cell according to an embodiment of the invention.

FIGS. 3-14 are cross-sectional views showing steps of a method for forming a multi-bit memory cell according to an exemplary embodiment of the invention. As shown in FIG. 3, a stack of conductive layers 10, 20, 30, 40 and 55 and phase change material layers 15, 25, 35 and 45 disposed between corresponding phase change material layers is formed. The first through fourth phase change material layers 15, 25, 35 and 45 have respective heights L1, L2, L3 and L4, and L1<L2<L3<L4. The first through fourth conductive layers 10, 20, 30 and 40, the top conductive layer 55 and the phase change material layers 15, 25, 35 and 45 can be formed over one another using any suitable technique, such as, for example, chemical vapor deposition.

Figure 4:
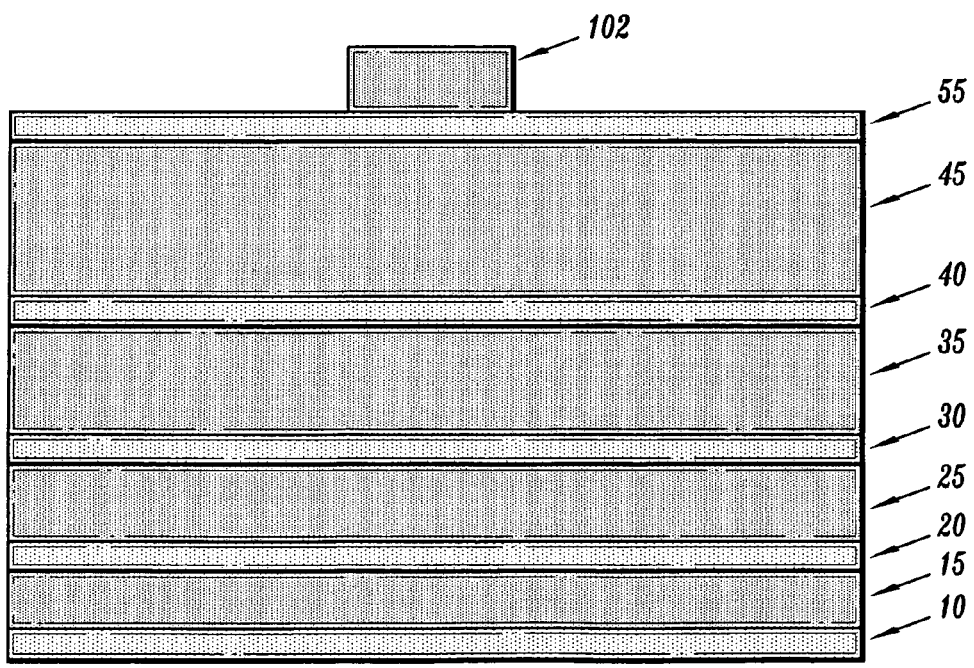

As shown in FIG. 4, a hard mask 102 is formed over the top conductive layer 55. The hard mask 102 is formed by depositing a mask layer over the top conductive layer 55 and patterning the hard mask layer. The hard mask 102 can be made of any suitable material, such as, for example, silicon nitride. The hard mask 102 is formed over a central portion of the top conductive layer 55.

Figure 5:
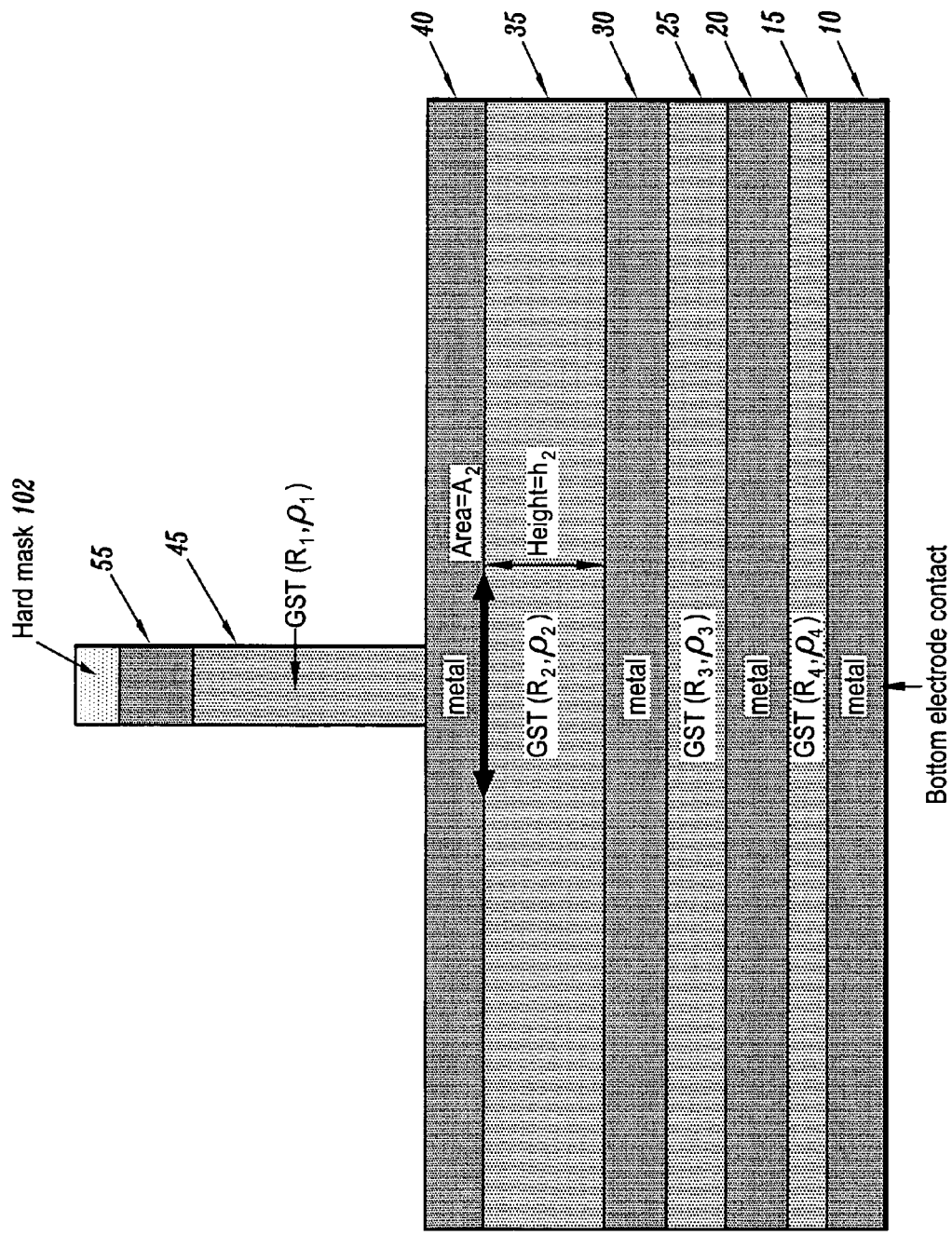

As shown in FIG. 5, the hard mask 102 is used to etch the top conductive layer 55 and the fourth phase change material layer 45. A two-step etch process is preferable to allow the etchant to stop at the fourth conductive layer 40.

Figure 6:
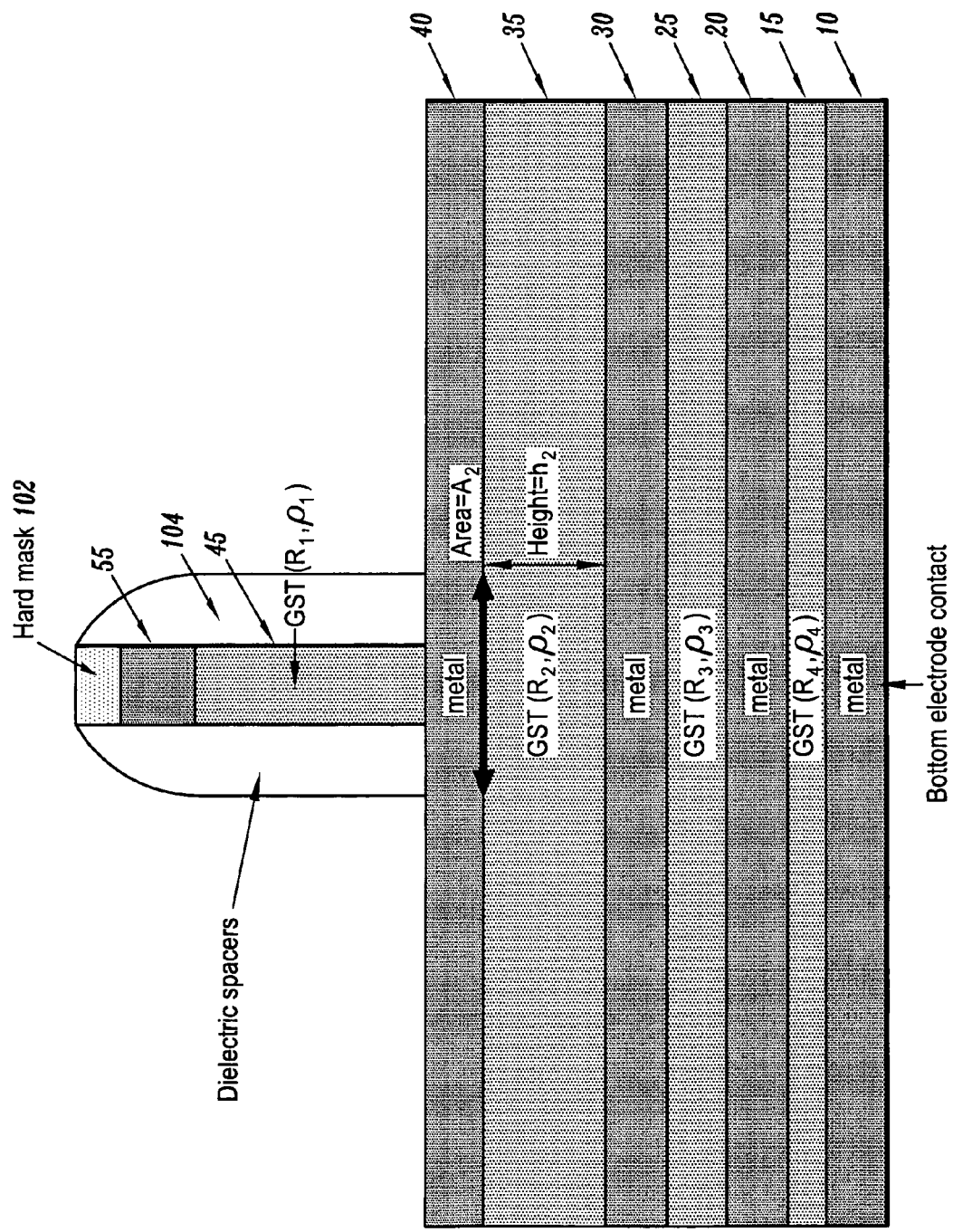

As shown in FIG. 6, first dielectric spacers 104 are formed on both sides of the hard mask 102, the top conductive layer 55 and the fourth phase change material layer 45. The first dielectric spacers 104 are formed by depositing a dielectric layer over the hard mask 102, the top conductive layer 55, the fourth phase change material layer 45, and the fourth conductive layer 40, and then anisotropically etching the dielectric layer. The dielectric spacers 104 can be made of any suitable material, such as, for example, silicon dioxide.

Figure 7:
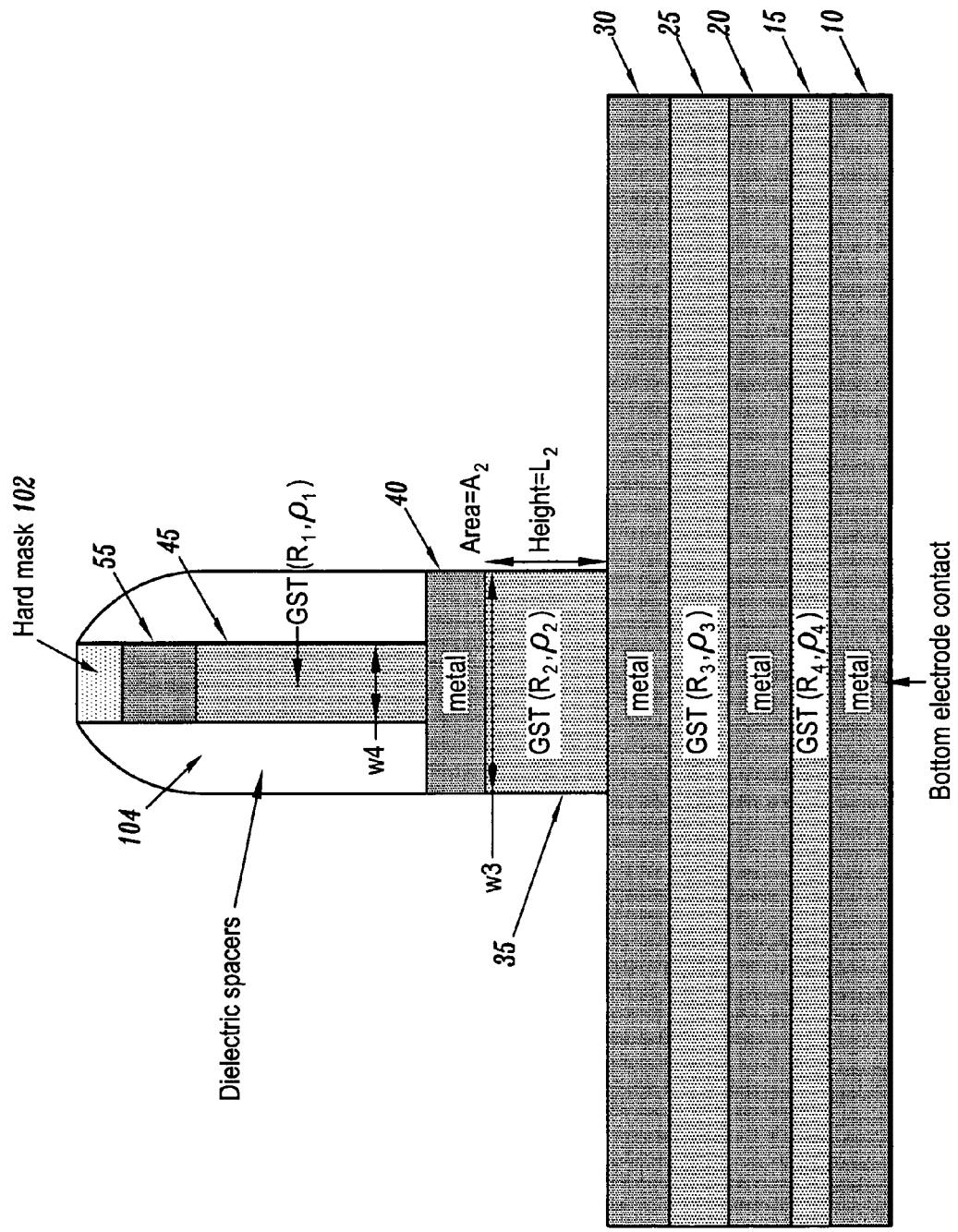

As shown in FIG. 7, the fourth conductive layer 40 and the third phase change material layer 35 are etched using the hard mask 102 and the first dielectric spacers 104 as an etch mask. As a result, the third phase change material layer 35 is etched to a wider width W3 than the width W4 of the fourth phase change material layer 45.

Figure 8:
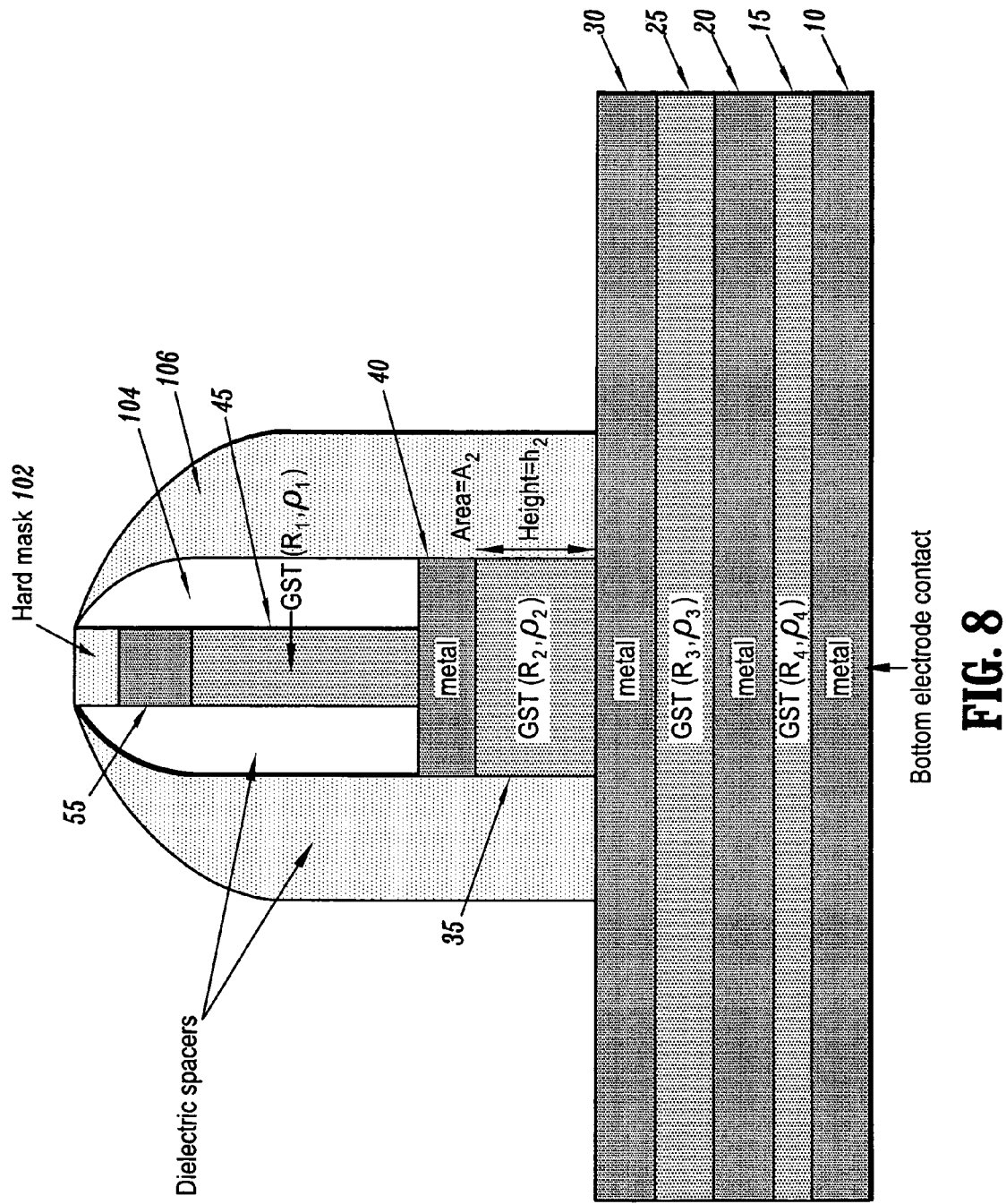

As shown in FIG. 8, second dielectric spacers 106 are formed on sides of the first dielectric spacers 104. The second dielectric spacers 106 are formed by depositing a dielectric layer over the hard mask 102, the first dielectric spacers 104, and the third conductive layer 30, and anisotropically etching the dielectric layer.

Figure 9:
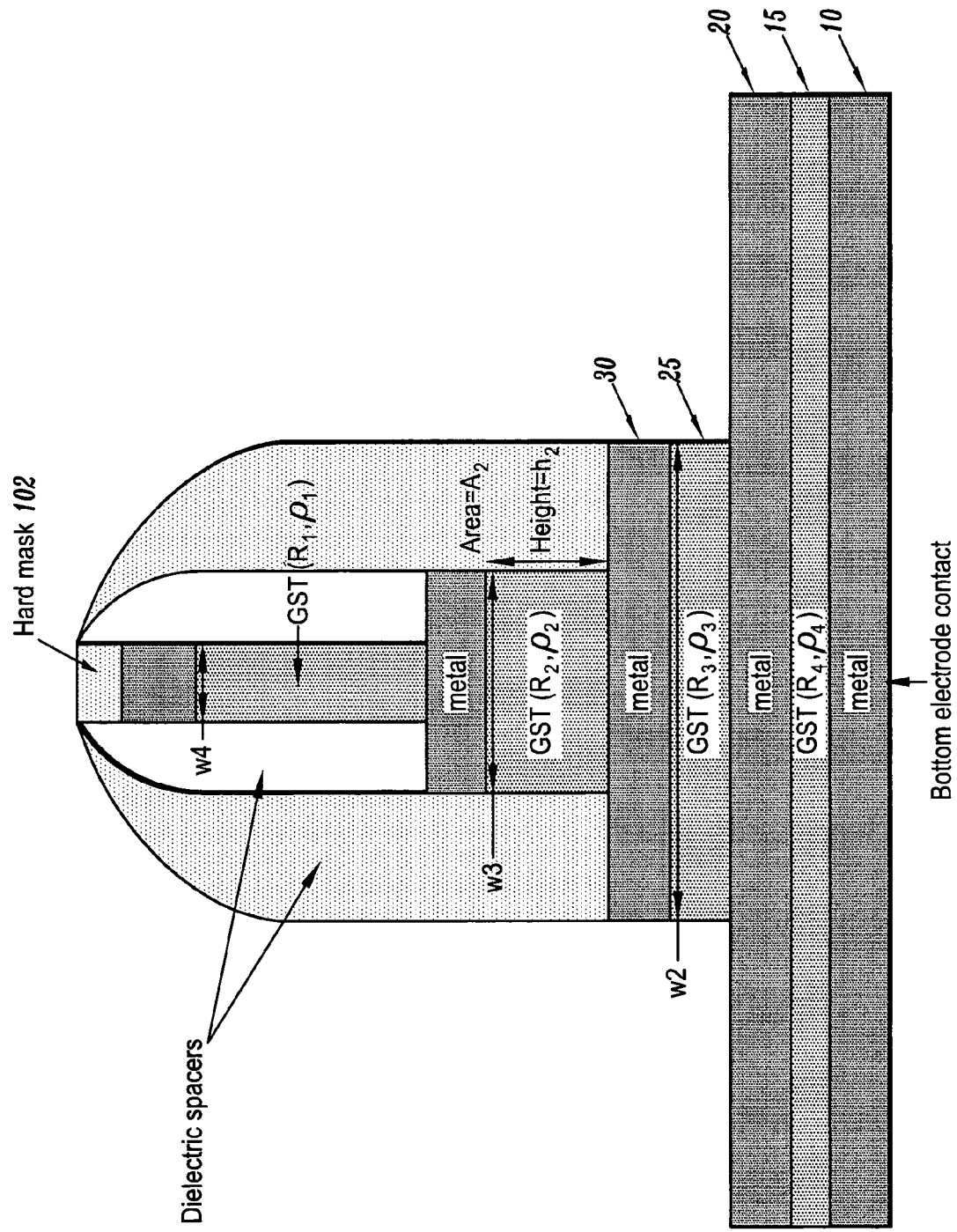

As shown in FIG. 9, the third conductive layer 30 and the second phase change material layer 25 are etched using the hard mask 102 and the second dielectric spacers 106 as an etchant mask. As a result, the second phase change material layer 25 is etched to a wider width W2 than the width W3 of the third phase change material layer 35 and the width W4 of the fourth phase change material layer 45.

Figure 10:
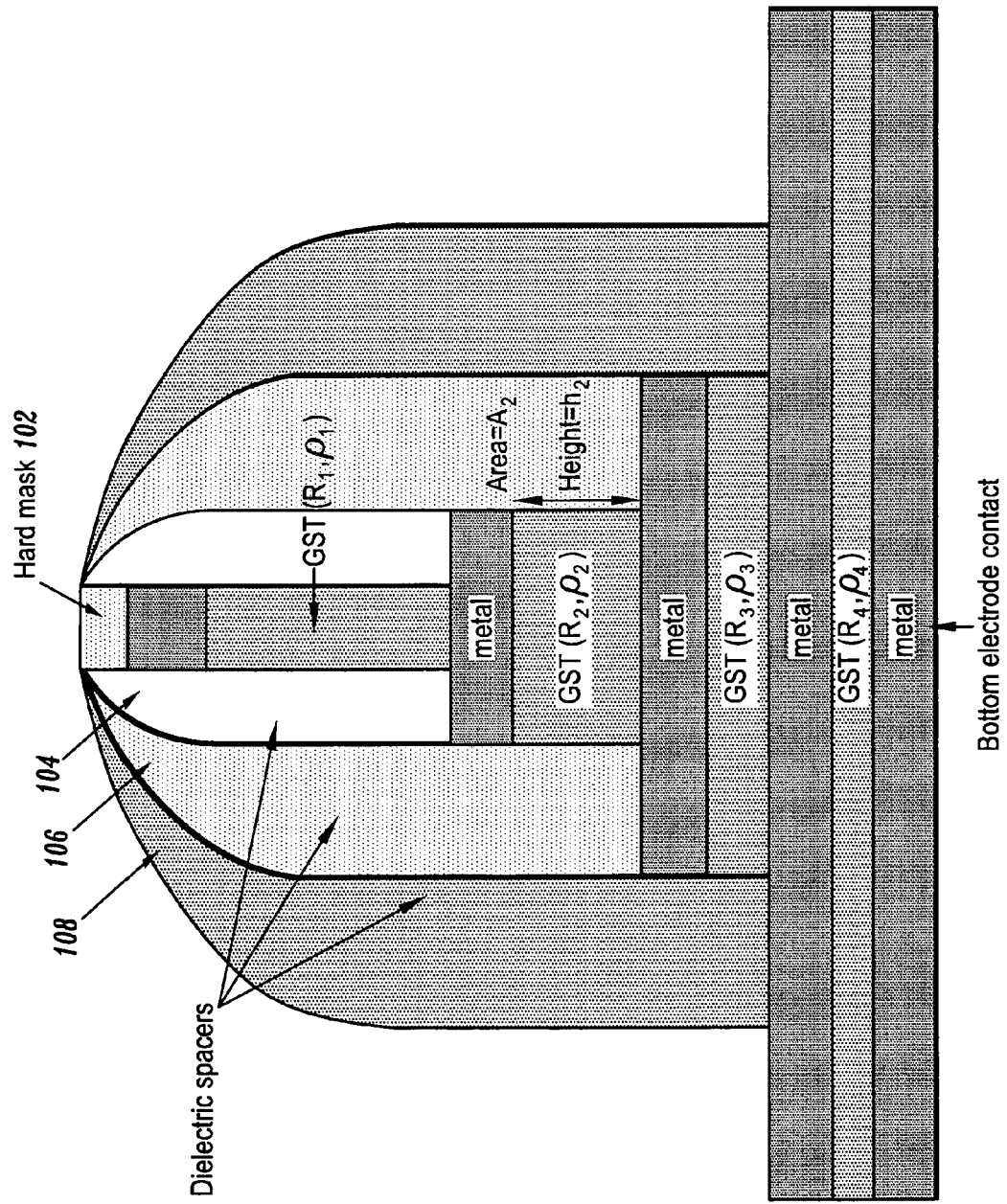

As shown in FIG. 10, third dielectric spacers 108 are formed on sides of the second dielectric spacers 106. The third dielectric spacers 108 are formed by depositing a dielectric layer over the hard mask 102, the second dielectric spacers 106 and the second conductive layer 20, and anisotropically etching the dielectric layer.

Figure 11:
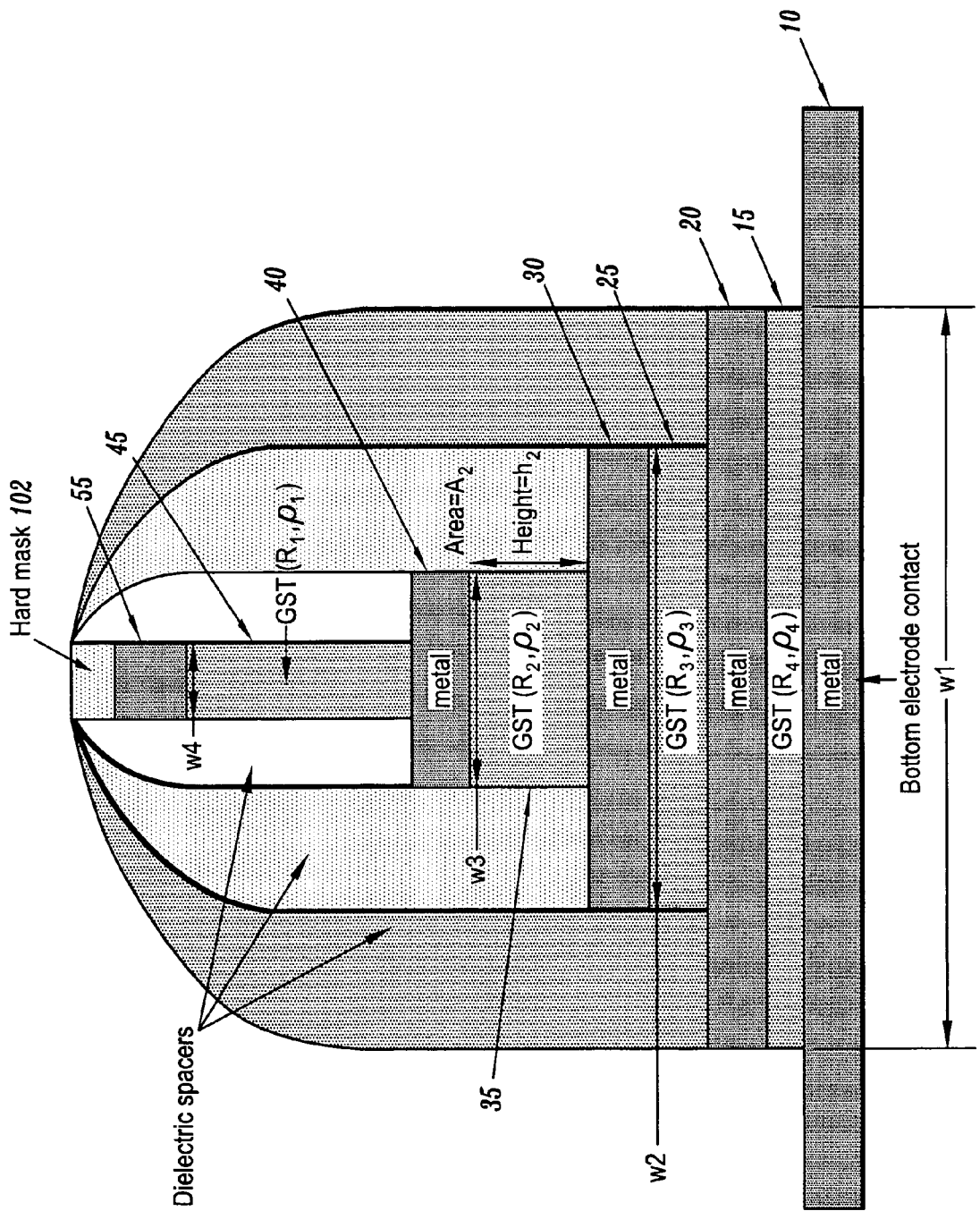

As shown in FIG. 11, the second conductive layer 20 and the first phase change material layer 15 are etched using the hard mask and the third dielectric spacers 108 as an etch mask. As a result, the first phase change material layer 15 is etched to a width W1 wider than the width W2 of the second phase change material layer 25, the width W3 of the third phase change material layer 35 and the width W4 of the fourth phase change material layer 45.

Figure 12:
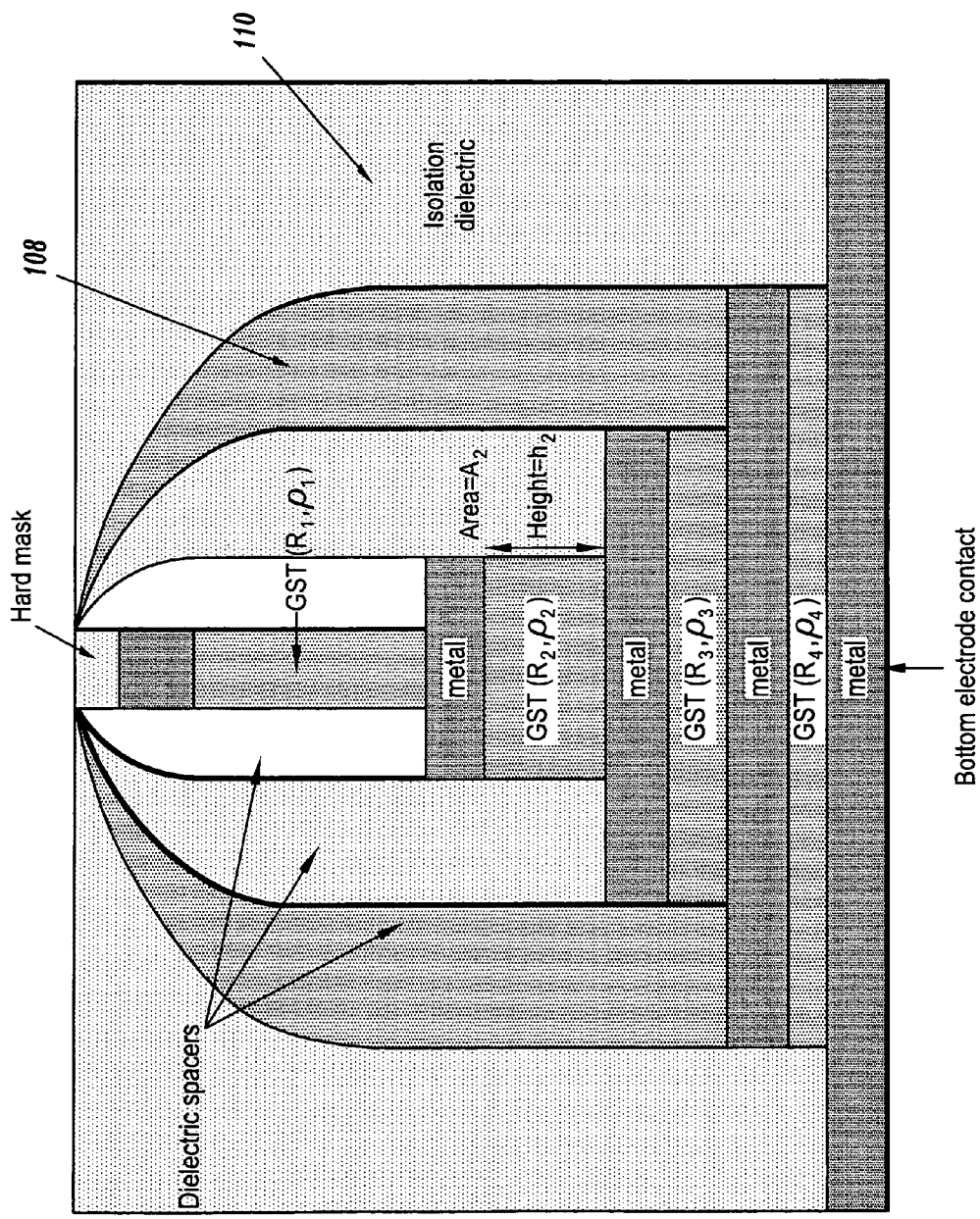

As shown in FIG. 12, an isolation dielectric layer 110 is formed over the third dielectric spacers 108 and the first conductive layer 10. The isolation dielectric layer 110 is formed by depositing a dielectric layer over the third dielectric spacers 108 and first conductive layer 10, and polising the dielectric layer to be flush with the hard mask 102. The dielectric layer can be polished using any suitable technique, such as, for example, chemical-mechanical polishing.

Figure 13:
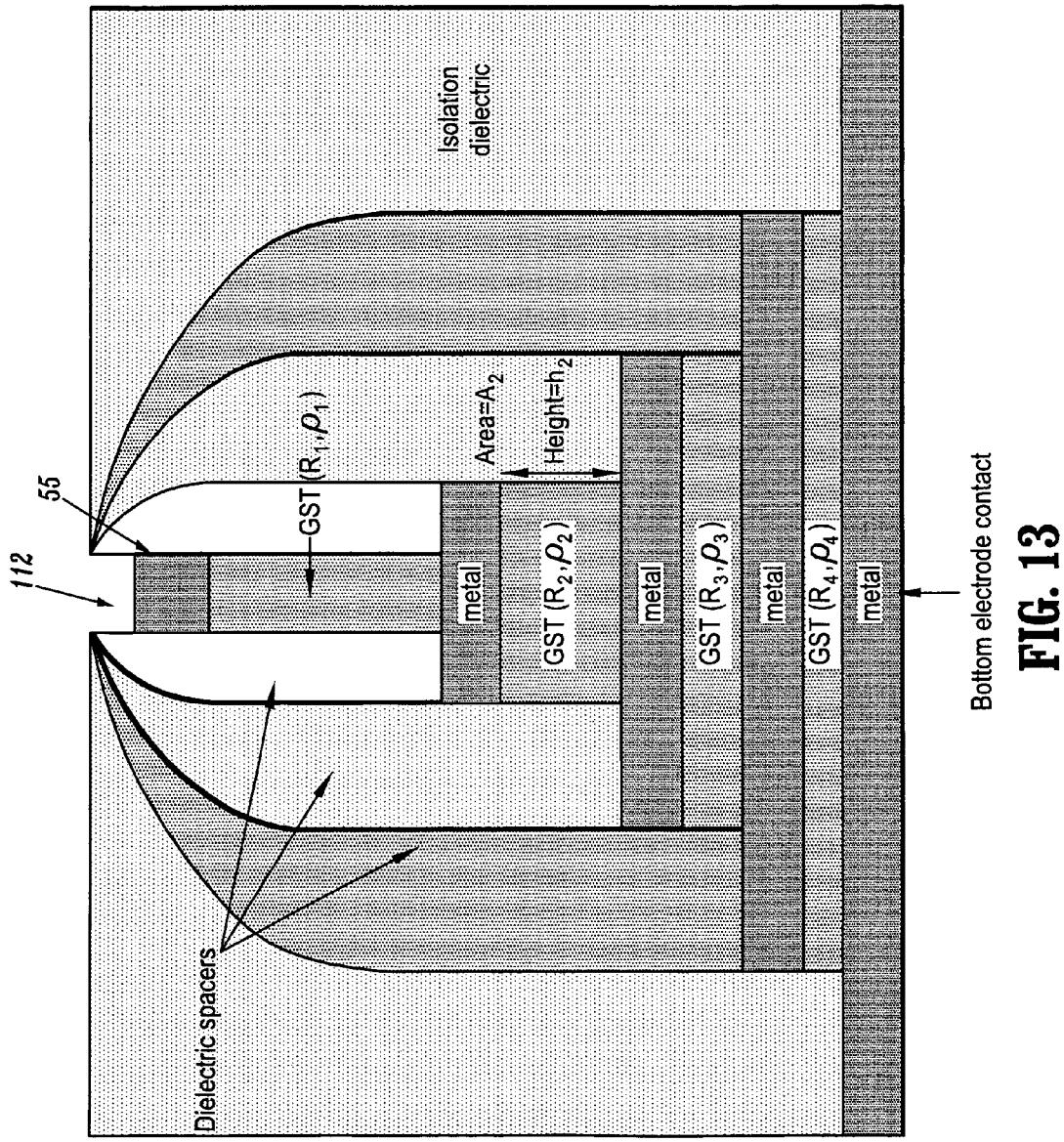

As shown in FIG. 13, the hard mask 102 is removed to form an opening 112 above the top conductive layer 55. The hard mask 102 can be removed using any suitable process, such as, for example, dry etching.

Figure 14:
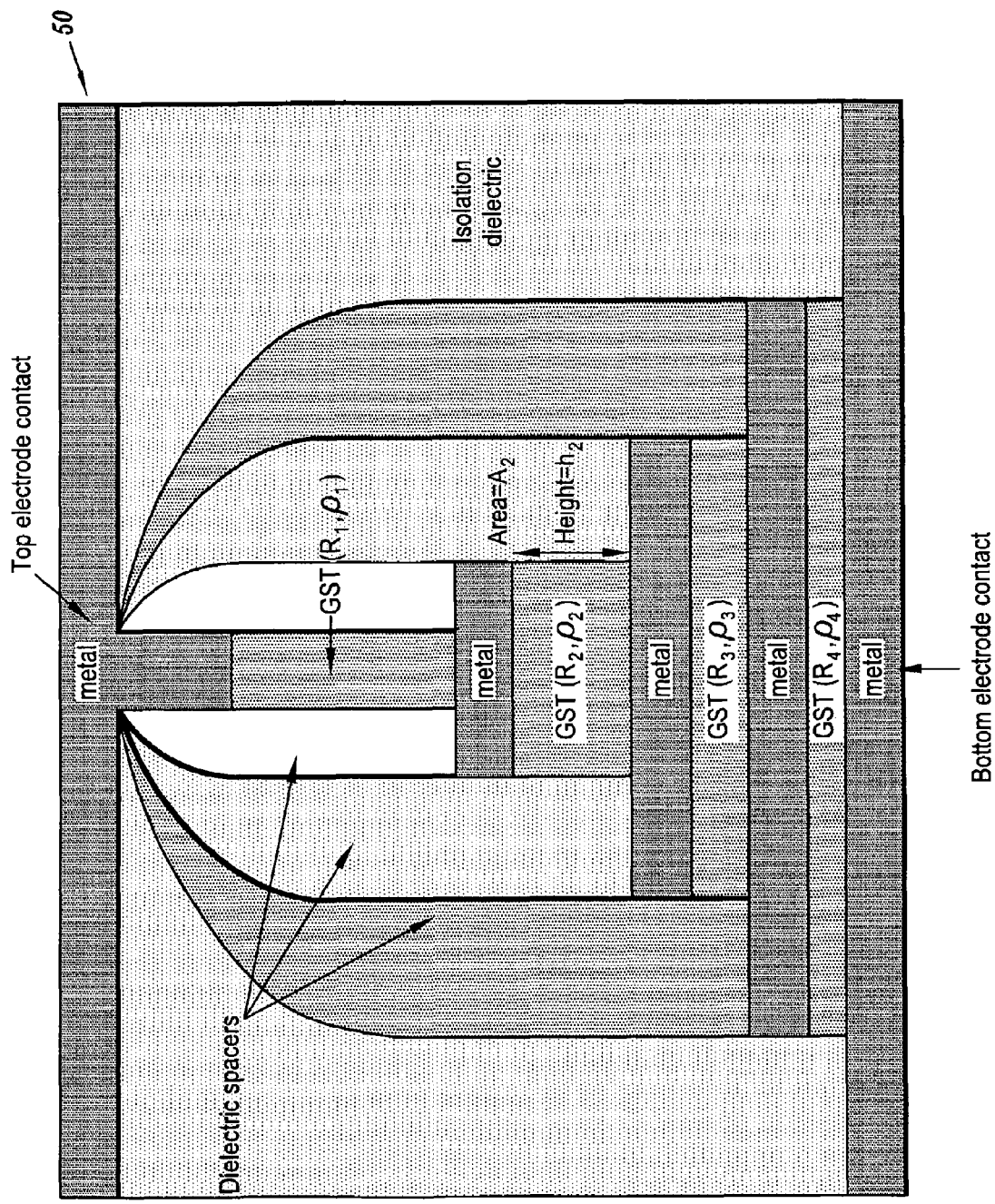

As shown in FIG. 14, a fifth conductive layer 50 is formed over the isolation dielectric layer 110. The fifth conductive layer 50 is formed by depositing a conductive layer over the isolation dielectric 110 and within the opening 112. The deposited conductive layer and the top conductive layer 55 form the fifth conductive layer 50 of the completed memory cell 1.

Although the illustrative embodiments have been described herein with reference to the accompanying drawings, it is to be understood that the present invention and method are not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A multi-bit phase change memory cell, comprising:
a stack of a plurality of conductive layers including a first outer conductive layer disposed at one side of the memory cell and a second outer conductive layer disposed at a side opposite to the one side of the memory cell, the plurality of conductive layers including a plurality of intermediate conductive layers disposed between the first and second outer conductive layers, each of the intermediate conductive layers having the same dimensions as an adjacent phase change material layer, wherein the plurality of conductive layers are made of at least one of Cu and Pt and wherein each of the plurality of conductive layers are made of the same material as one another;
a plurality of phase change material layers, each of the phase change material layers disposed between a corresponding pair of conductive layers and having electrical resistances that are different from one another, and wherein each of said plurality of phase change material layers has a different height from one another and wherein the height of each of the plurality of phase change layers increases along a direction from the first outer conductor layer to the second outer conductive layer and a surface area of each of the plurality of phase change layers decreases along the direction from the first outer conductor layer to the second outer conductive layer, and
wherein the multi-bit phase change memory cell is adapted such that when each of the plurality of phase change material layers are in an amorphous state then each of the plurality of phase change material layers each have the same resistivity and the electrical resistance of each of the plurality of phase change material layers increases along the direction from the first outer conductive layer to the second outer conductive layer.

2. The multi-bit phase change memory cell of claim 1, wherein each of the plurality of phase change material layers have a different phase transition temperature.

3. The multi-bit phase change memory cell of claim 1, wherein each of the plurality of phase change material layers have the same phase transition temperature.

4. The multi-bit phase change memory cell of claim 1, further comprising a dielectric layer formed between the first outer electrode and the second outer electrode and along sides of at least one other conductive layer and a phase change material layer disposed directly adjacent to the at least one other conductive layer.

5. The multi-bit phase change memory cell of claim 1, wherein the phase change material layers are made of the same material.

6. The multi-bit phase change memory cell of claim 1, wherein each of the phase change material layers are made of a different material.

7. The multi-bit phase change memory cell of claim 1, wherein the phase change material layers are made of $Ge_2Sb_2Te_5$.

8. The multi-bit phase change memory cell of claim 1, wherein the number of phase change material layers is equal to $2^n$, where n is the number of bits stored in the memory cell.

9. A multi-bit phase change memory, comprising:
an array of multi-bit phase change memory cells, each of the multi-bit phase change memory cells comprising:
a stack of a plurality of conductive layers including a first outer conductive layer disposed at one side of the memory cell and a second outer conductive layer disposed at a side opposite to the one side of the memory cell and a plurality of phase change material layers, each of the phase change material layers disposed between a corresponding pair of conductive layers and having electrical resistances that are different from one another, wherein the plurality of conductive layers includes a plurality of intermediate conductive layers disposed between the first and second outer conductive layers, each of the intermediate conductive layers having the same dimensions as an adjacent phase change material layer, wherein the plurality of conductive layers are made of at least one of Cu and Pt and wherein at least one of the plurality of conductive layers is made of a different material from another of the plurality of conductive layers;
a programming circuit that writes data to the array of multi-bit phase change memory cells; and
a sensing circuit that reads out data from the array of multi-bit phase change memory cells, and wherein each of said plurality of phase change material layers has a different height from one another and wherein the height of each of the plurality of phase change layers increases along a direction from the first outer conductor layer to the second outer conductive layer and a surface area of each of the plurality of phase change layers decreases along the direction from the first outer conductor layer to the second outer conductive layer, and wherein the multi-bit phase change memory cells are adapted such that when each of the plurality of phase change material layers are in an amorphous state than each of the plurality of phase change material layers each have the same resistivity and the electrical resistance of each of the plurality of phase change material layers increases along the direction from the first outer conductive layer to the second outer conductive layer.

10. The multi-bit phase change memory of claim 9, wherein the plurality of phase change material layers are made of $Ge_2Sb_2Te_5$.

* * * * *